United States Patent
Paul et al.

(10) Patent No.: US 10,823,802 B2
(45) Date of Patent: Nov. 3, 2020

(54) METHOD AND COMPUTER FOR CREATING A PULSE SEQUENCE FOR CONTROLLING A MAGNETIC RESONANCE TOMOGRAPHY SYSTEM

(71) Applicant: Siemens Healthcare GmbH, Erlangen (DE)

(72) Inventors: Dominik Paul, Bubenreuth (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/294,350

(22) Filed: Mar. 6, 2019

(65) Prior Publication Data
US 2019/0277930 A1  Sep. 12, 2019

(30) Foreign Application Priority Data
Mar. 6, 2018 (EP) .................... 18160255

(51) Int. Cl.
*G01V 3/00* (2006.01)
*G01R 33/54* (2006.01)
*G01R 33/483* (2006.01)
*G01R 33/56* (2006.01)
*G01R 33/561* (2006.01)
*G01R 33/563* (2006.01)

(52) U.S. Cl.
CPC ....... *G01R 33/543* (2013.01); *G01R 33/4835* (2013.01); *G01R 33/4838* (2013.01); *G01R 33/5602* (2013.01); *G01R 33/5607* (2013.01); *G01R 33/5611* (2013.01); *G01R 33/5615* (2013.01); *G01R 33/56341* (2013.01)

(58) Field of Classification Search
CPC .............. G01R 33/543; G01R 33/5659; G01R 33/3415; G01R 33/36; A61B 5/055
USPC ......................................................... 324/309
See application file for complete search history.

(56) References Cited

U.S. PATENT DOCUMENTS

| | | | |
|---|---|---|---|
| 6,505,064 B1 * | 1/2003 | Liu ....................... | G06T 11/206 |
| | | | 324/307 |
| 2017/0089999 A1 * | 3/2017 | Zeller .............. | G01R 33/56563 |
| 2017/0108567 A1 | 4/2017 | Bhat et al. | |
| 2017/0205480 A1 * | 7/2017 | George ............ | G01R 33/34015 |

(Continued)

OTHER PUBLICATIONS

Setsompop, Kawin et al. "Blipped-Controlled Aliasing in Parallel Imaging for Simultaneous Multislice Echo Planar Imaging with Reduced g-Factor Penalty" Magnetic Resonance in Medicine, vol. 67, pp. 1210-1224, 2012 (first published online 2011).

(Continued)

*Primary Examiner* — Walter L Lindsay, Jr.
*Assistant Examiner* — Frederick Wenderoth
(74) *Attorney, Agent, or Firm* — Schiff Hardin LLP

(57) ABSTRACT

In a method and computer for creating a pulse sequence for controlling a magnetic resonance (MR) tomography system to generate image data, raw MR data are acquired by exciting different transverse magnetizations in a number of sub-volumes of the subject, with a sequence of pulse iterations being executed that each prepare, excite and read out sub-volumes. The pulse iterations are designed so that a readout occurs when the pulse sequence is applied between a preparation of two spatially directly adjacent sub-volumes.

13 Claims, 6 Drawing Sheets

(56) References Cited

U.S. PATENT DOCUMENTS

2017/0328971 A1 11/2017 Bilgic et al.
2018/0031659 A1 2/2018 Bhat et al.

OTHER PUBLICATIONS

Souza, S. P. et al. "SIMA: Simultaneous Multislice Acquisition of MR Images by Hadamard-Encoded Excitation" Journal of Computer Assisted Tomography, vol. 12, No. 6, pp. 1026-1030, 1988; 1988.
Breutigam, Nora-Josefin et al. "Simultaneous Multi-Contrast Imaging with Readout-Segmented EPI" Proceedings 25th Annual ISMRM Meeting; p. 0520; Apr. 2017; XP040688088.
Markus Barth et al: "Simultaneous multislice (SMS) imaging techniques : SMS Imaging"; Magnetic Resonance in Medicine., Bd. 75, Nr. 1, Aug. 26, 2015 (Aug. 26, 2015), pp. 63-81, XP055408927, US ISSN: 0740-31; 2015.
Breuer, Felix A. et al.: "Controlled Aliasing in Parallel Imaging Results in Higher Acceleration (CAIPIRINHA) for Multi-Slice Imaging"; in: Magnetic Resonance in Medicine 53: S. 684-691 (2005); 2005.
Larkman, David J. et al. "Use of Multicoil Arrays for Separation of Signal from Multiple Slices Simultaneously Excited" Journal of Magnetic Resonance Imaging; vol. 13; pp. 313-317; 2001; 2001.
European Search Report for Application No. 18160255.8, dated Aug. 30, 2018.

\* cited by examiner

FIG 4   Stand der Technik

METHOD AND COMPUTER FOR CREATING A PULSE SEQUENCE FOR CONTROLLING A MAGNETIC RESONANCE TOMOGRAPHY SYSTEM

BACKGROUND OF THE INVENTION

Field of the Invention

The invention concerns a method and a computer for creating a pulse sequence for controlling a magnetic resonance (MR) tomography system, and such a control method and a corresponding control computer, and a corresponding magnetic resonance tomography system.

Description of the Prior Art

Imaging systems that are based on a method of magnetic resonance scanning, in particular magnetic resonance imaging, are known as magnetic resonance tomography systems, have successfully established and proven themselves for varied applications. With this type of image acquisition, usually a static basic magnetic field $B_0$, which is used for initial alignment and homogenization of magnetic dipoles for examination, is overlaid with a rapidly-switched magnetic field, known as the gradient field, for spatial resolution of the imaging signal. In order to determine material properties of an examination object for imaging, the dephasing or relaxation time of the excited nuclear spins following a deflection of the magnetization thereof, determined from the initial alignment, so that different relaxation mechanisms or relaxation times that are typical for the material can be identified. The deflection usually occurs due to a number of RF pulses, and the spatial resolution is based on a temporally fixed manipulation of the deflected magnetization with the use of the gradient field. These are defined in a scan sequence or pulse sequence, which defines an exact temporal sequence of RF pulses, the change in the gradient field (by emitting a switching sequence of gradient pulses) and determining scan values. In addition to the relaxation there is also a series of further mechanisms for contrast forming, such as flux measurement and diffusion imaging.

There is typically an association between measured magnetization, from which the material properties can be derived, and a spatial coordinate of the measured magnetization in the spatial domain in which the examination object is arranged, with the use of an intermediate step. In this intermediate step, acquired magnetic resonance raw data entered at readout points in an organization referred to as k-space, with the coordinates of k-space being encoded as a function of the gradient field. The value of the magnetization (in particular the transverse magnetization, determined in a plane transverse to the above-described basic magnetic field) at a specific location of the examination object can be determined from the k-space data with the use of a Fourier Transform. In other words, the k-space data (magnitude and phase) are required to calculate the strength of the signal, and optionally its phase, in the spatial domain.

Magnetic resonance tomography is a relatively slowly functioning type of imaging method because the data are sequentially acquired along trajectories, such as lines or spirals, in the Fourier domain (k-space). The method of acquiring images in two-dimensional slices is much less susceptible to errors compared to acquisition in three dimensions, because the number of encoding steps is smaller than in a three-dimensional case. Therefore, in many applications image volumes with stacks of two-dimensional slices are used instead of a single three-dimensional acquisition. However, the image acquisition times are very long due to the long relaxation times of the spins, and this means a reduction in comfort for the patient being examined. The patients cannot leave the magnetic resonance scanner for a brief period during acquisition, or even change position, since this would nullify the image acquisition process due to the change in position and the entire process would have to begin all over again. Consequently, an important goal is to accelerate acquisition of two-dimensional slice stacks.

With a different type of scanning, selectively excited sub-volumes or sub-volumes (known as "slices", or "slabs") are spatially encoded with the use of a three-dimensional scanning method. There is a need to accelerate the acquisition speed with this type of procedure as well.

In order to accelerate image acquisition, simultaneous image acquisition techniques can be used. A number of slices are simultaneously excited and read out (see for example Breuer et al. MRM 53: 684 (2005), Souza et al. JCAT 12: 1026 (1988), Larkman et al. JMRI 13: 313 (2001), (MRM=Magnetic Resonance in Medicine, JCAT=Journal of Computer Assisted Tomography, JMRI=Journal of Magnetic Resonance Imaging)) with these technologies known by the names "Simultaneous Multi-Slice" (SMS image acquisition), "Slice Acceleration" or also "Multiband". For example, with an acceleration factor of three, three slices are simultaneously excited and read out. This reduces the necessary repetition time TR (repetition time TR=time until successive pulse sequences are applied to the same slice) to ⅓ of the required time. Advantageously, the scan time is reduced or the temporal scan rate is increased with these methods.

Even when scanning selectively excited sub-volumes there is the possibility of scanning a number of sub-volumes simultaneously with the use of "multi-slab" imaging in order to accelerate the acquisition process. A procedure of this kind can be regarded as an intermediate stage between 2D-multi-slice imaging and complete 3D imaging.

A serious drawback of simultaneous acquisition of a number of sub-volumes by such known methods is that image artifacts can occur during acquisition, for example due to crosstalk between two adjacent sub-volumes, or due to magnetization transfer effects, which adversely affect the image quality.

SUMMARY OF THE INVENTION

An object of the present invention is to avoid the drawbacks described above and to achieve improved acquisition of multi-contrast SMS magnetic resonance images. This includes the object of providing a method and a computer for creating a pulse sequence, so that a pulse sequence for controlling a magnetic resonance tomography system for a corresponding control method or a corresponding control computer and a corresponding magnetic resonance tomography system can be provided.

The inventive method is used, just like the inventive computer, for creating a pulse sequence for controlling a magnetic resonance tomography system for acquiring MR data generate magnetic resonance image data of an examination object, in which, in order to acquire the magnetic resonance raw data, different transverse magnetizations are excited in a number of mutually parallel sub-volumes that are to be imaged. In other words, the invention concerns multi-contrast acquisitions in which a number of slices are simultaneously excited, wherein at least one of the simultaneously excited slices experiences a different preparation compared to one of the other simultaneously excited slices. This preparation is used for achieving the differences in the transverse magnetizations between the various sub-volumes. This can occur, for example, by the use of preparation modules that act only on one subset of the slices (sub-volumes) and/or due to time offset of the excitation pulses and/or due to different flip angles. Initially there is no limitation of the sequence types. A two-dimensional acquisition is advantageous (for example TSE, GRE, EPI, segmented EPI). This application of the method is particularly advantageous when crosstalk or magnetization transfer effects can occur. This is the case especially with the FLAIR sequence since in this sequence the FLAIR inversion slice is intentionally selected to be so wide that it partially overlaps the adjoining slices.

Within the context of the inventive method the pulse sequence includes a sequence of pulse iterations that are designed to prepare, excite and read out the sub-volumes. The pulse iterations are arranged in the pulse sequence such that a readout occurs when the pulse sequence is applied between a preparation of two spatially directly adjacent sub-volumes. This preferably applies to the majority of the sub-volumes, particularly preferably to all sub-volumes on which the pulse sequence acts.

With the acquisition methods according to the invention, sub-volumes are simultaneously excited and read out. These can be two adjacent sub-volumes, but also non-adjacent sub-volumes.

In addition to a preparation of individual sub-volumes, the sequence of pulse iterations is preferably designed to simultaneously excite and read out the same or further sub-volumes. It should be noted that these do not have to be adjacent sub-volumes (see above). Instead, for example two non-adjacent sub-volumes can be simultaneously excited and read out. It is not the excitation that is important for the inventive method, but rather that two (or a majority or all) adjacent sub-volumes are prepared in different pulse iterations.

Preferably, the simultaneously excited and read out slices are spaced apart to the maximum. In the case of four slices, with two simultaneously read out slices, for example preferably slices 1 and 3 and slices 2 and 4, are simultaneously excited and read out. Depending on the application it is also preferred that not just two, but a number of slices are simultaneously excited and read out. The inventive method can then of course likewise be applied. With a number of N slices, of which A are read out simultaneously, preferably the slices i (where i<N/A), i+(N/A), i+((N+1)/A), . . . would be simultaneously excited and read out accordingly.

An inventive pulse sequence is created with the inventive method and is used for controlling a magnetic resonance tomography system in order to generate magnetic resonance image data of an examination object, in which magnetic resonance raw data are acquired, wherein different transverse magnetizations are excited in a number of sub-volumes for imaging and are used for imaging, wherein these different transverse magnetizations exist simultaneously, at least in one period of the scan.

The inventive pulse sequence includes a sequence of pulse iterations that are designed to prepare, excite and read out sub-volumes, wherein the pulse iterations are arranged in the pulse sequence such that a readout occurs when the pulse sequence is applied between a preparation of two spatially directly adjacent sub-volumes. As noted above, this applies preferably to the majority the sub-volumes, particularly preferably to all sub-volumes, on which the pulse sequence acts.

The first pulse iteration preferably includes a first preparation pulse module for preparation of a first sub-volume, and a first readout module after the first preparation pulse module, and the second pulse iteration preferably comprises a second preparation pulse module for preparation of a second sub-volume, and a second readout module after the second preparation pulse module. The preparation pulse modules are arranged in the pulse sequence such that when the pulse sequence is applied, directly adjacent sub-volumes are essentially, in particular always, prepared in different pulse iterations.

An inventive computer for creating an inventive pulse sequence, can be called a "pulse sequence determining system", and includes a creation processor configured to generate a pulse sequence having at least two successive pulse iterations for preparing, exciting and reading out sub-volumes.

The creation processor is designed such that pulse iterations are arranged in the pulse sequence so that a readout occurs when the pulse sequence is applied between a preparation of two spatially directly adjacent sub-volumes. The preceding statements also apply accordingly.

The creation processor is preferably also configured to arrange a first preparation pulse module in the first pulse iteration for preparation of a first sub-volume followed by a first readout module and to arrange a second preparation pulse module in the second pulse iteration for the preparation of a second sub-volume followed by a second readout module, so that the preparation pulse module is arranged such that directly adjacent sub-volumes are essentially, in particular always, prepared in different pulse iterations when the pulse sequence is applied.

An inventive control method for controlling a magnetic resonance tomography system in order to generate magnetic resonance image data of an examination object, in which magnetic resonance raw data is acquired, wherein different transverse magnetizations are excited in a plurality of sub-volumes for imaging and are used for imaging, has the following steps.

The inventive pulse sequence is created in or supplied to a computer of a magnetic resonance tomography system.

The pulse sequence is executed during the course by a magnetic resonance tomography acquisition of the magnetic resonance tomography system, wherein the sub-volumes are prepared on the basis of the pulse sequence. The first sub-volume is preferably prepared with the first preparation pulse module and the second sub-volume with the second preparation pulse.

An inventive control computer for controlling a magnetic resonance tomography system is configured for carrying out an inventive control method and/or includes an inventive device, in other words a pulse sequence-determining system.

An inventive magnetic resonance tomography system includes the inventive control computer.

The majority of the components of the control computer can be implemented wholly or partially in the form of software modules in a processor of the control computer. An implementation largely in terms of software has the advantage that control computers that are already in use can easily be retrofitted by a software update in order to operate inventively. For this purpose, the present invention also encompasses a non-transitory, computer-readable data storage medium encoded with programming instructions that, when loaded into a computer, cause the computer to produce the pulse sequence in accordance with the invention, as described above. The present invention also encompasses a non-transitory, computer-readable data storage medium that is loaded into a control computer of a magnetic resonance apparatus, and that is encoded with programming instructions that cause the control computer to operate the magnetic resonance apparatus, or the magnetic resonance data acquisition scanner thereof, so as to implement any or all embodiments of the method according to the invention, using the pulse sequence according to the invention, as described above.

In addition to the computer code, the storage medium can optionally have additional components, such as documentation and/or additional components, also hardware components, such as hardware keys (dongles, etc.) in order to use the software.

The pulse sequence preferably includes at least two successive pulse iterations, as has been described above. The first pulse iteration includes a first preparation pulse module for preparation of a first sub-volume and a first readout module after the first preparation pulse module and the second pulse iteration includes a second preparation pulse module for preparation of a second sub-volume, and a second readout module after the second preparation pulse module. A preparation module for preparation of a sub-volume preferably includes at least one preparation pulse whose form depends on the contrast to be acquired (for example a 180° pulse for a FLAIR sequence).

Between the first preparation pulse module and the first readout module, the first pulse iteration preferably includes at least a third preparation pulse module for preparing a third sub-volume and preferably after the first readout module, a third readout module. The first and third sub-volumes are not directly adjacent, or between the first and the third sub-volumes there is a further sub-volume which is not prepared in the first pulse iteration.

Alternatively or additionally, between the second preparation pulse module and the second readout module, the second pulse iteration preferably includes at least a fourth preparation pulse module for preparing a fourth sub-volume and preferably after the second readout module, a fourth readout module. The second and fourth sub-volumes are not directly adjacent, or between the second and the fourth sub-volumes there is a further sub-volume which is not prepared in the second pulse iteration.

The pulse sequence is preferably created on the basis of an automatically determined sequence table. Firstly, a sub-volume quantity of spatially directly adjacent, parallel sub-volumes, an excitation quantity of the simultaneously excited sub-volumes of the sub-volume quantity and a scan quantity comprising the scans to be performed on the sub-volumes is entered, which constitute the basis for determining the sequence table. The temporal positioning of the preparation pulse modules and the readout modules is implemented such that directly adjacent sub-volumes are essentially, in particular always, prepared in different pulse iterations when the pulse sequence is applied. A readout therefore occurs between the preparation of two spatially directly adjacent sub-volumes.

The pulse sequence is preferably formed such that the time intervals of groups of preparation pulse modules, in particular all preparation pulse modules, for preparation of directly adjacent sub-volumes is essentially the same. Each sub-volume with (either) odd-numbered or even-numbered position is preferably successively prepared in a first pulse iteration, in particular before the first readout module.

The pulse sequence preferably includes a sequence of the group EPI (Echo Planar Imaging), in particular segmented EPI, GRE (Gradient Echo), RESOLVE (echo planar imaging sequence segmented in the readout direction), SE (Spin Echo), STEAM (Stimulated Echo Acquisition Mode), STIR (Short-Tau Inversion Recovery), TSE (Turbo-Spin-Echo) and FLAIR (Fluid Attenuated Inversion Recovery). A FLAIR sequence, in other words an MRT sequence, is particularly preferred here, with which a distinction can be made between free and tissue-linked fluid.

The pulse sequence is preferably designed for acquiring one of the following contrasts:
  spin-grid relaxation T1 (longitudinal relaxation time)
  spin-spin relaxation T2 (transverse relaxation time)
  proton density PD
The following contrast combinations are preferred:
  combination with inversion preparations, in particular
  T1 or T2 or PD combined with T1 FLAIR or T2 FLAIR or PD FLAIR
  T1 or T2 or PD combined with T1 STIR or T2 STIR or PD STIR
  combination with spatially selective fat saturation, in particular
  T1 or T2 or PD combined with T1-fs or T2-fs or PD-fs (fs: fat saturation)
  combination with diffusion, in particular
  EPI T2* combined with EPI diffusion-weighted imaging, RESOLVE T2* combined with RESOLVE diffusion-weighted imaging,
  T1-preparation (STEAM), in particular
  T2 combined with T1-STEAM.

The pulse sequence preferably includes further pulses or gradients, in particular spoiler gradients, diffusion gradients or flux compensation gradients.

A preferred control method has the following steps:
  selecting a sub-volume quantity of spatially directly adjacent, parallel sub-volumes.
  selecting an excitation quantity of the simultaneously excited sub-volumes of the sub-volume quantity.
  selecting a scan quantity comprising the scans to be performed on the sub-volumes. These scans to be performed can exist for example as repetitions (in other words repetition patterns of sub-volumes) or as concatenations (linking patterns of sub-volumes).
  automatic creation of a pulse sequence according to the inventive method, wherein the distribution of the preparation pulse module among the scan quantity is selected such that within a scan as few adjacent sub-volumes as possible, in particular no adjacent sub-volumes, are prepared by one of the preparation pulse modules (in other words, simultaneously). A pulse sequence is automatically created in particular by means of application of a temporal sequence table (see above).
  preparation of the sub-volumes by means of the pulse sequence for a scan, wherein preferably sub-volumes are each simultaneously excited and read out in one scan according to the excitation quantity and of these simultaneously excited and read out sub-volumes, at least one sub-volume respectively was prepared in advance with a preparation pulse module (in particular by considering the sequence table).
  repetition of the preparation of the sub-volumes until all scans, in other words the repetitions or concatenations mentioned in the example, have been acquired.

DESCRIPTION OF THE PREFERRED EMBODIMENTS

Very simplified diagrams of pulse sequences are shown below. For a better understanding of the invention the various pulses are partially shown as a function of the time t on a common timeline or in a table. Normally a pulse diagram of a gradient echo sequence shows the radio frequency pulses (the RF pulses) to be emitted as well as the gradient pulses on different superposed time axes. Conventionally the RF pulses are shown on a radio frequency pulse-time axis and the gradient pulses on three gradient pulse-time axes, which correspond to three spatial directions. Therefore, for example, readout gradient pulses can be distributed in respect of their amplitudes on the three gradient axes, and therefore be oriented in the space as needed.

Elements that are primarily essential to the invention or are helpful for an understanding thereof are shown in the following figures.

Figure 1:
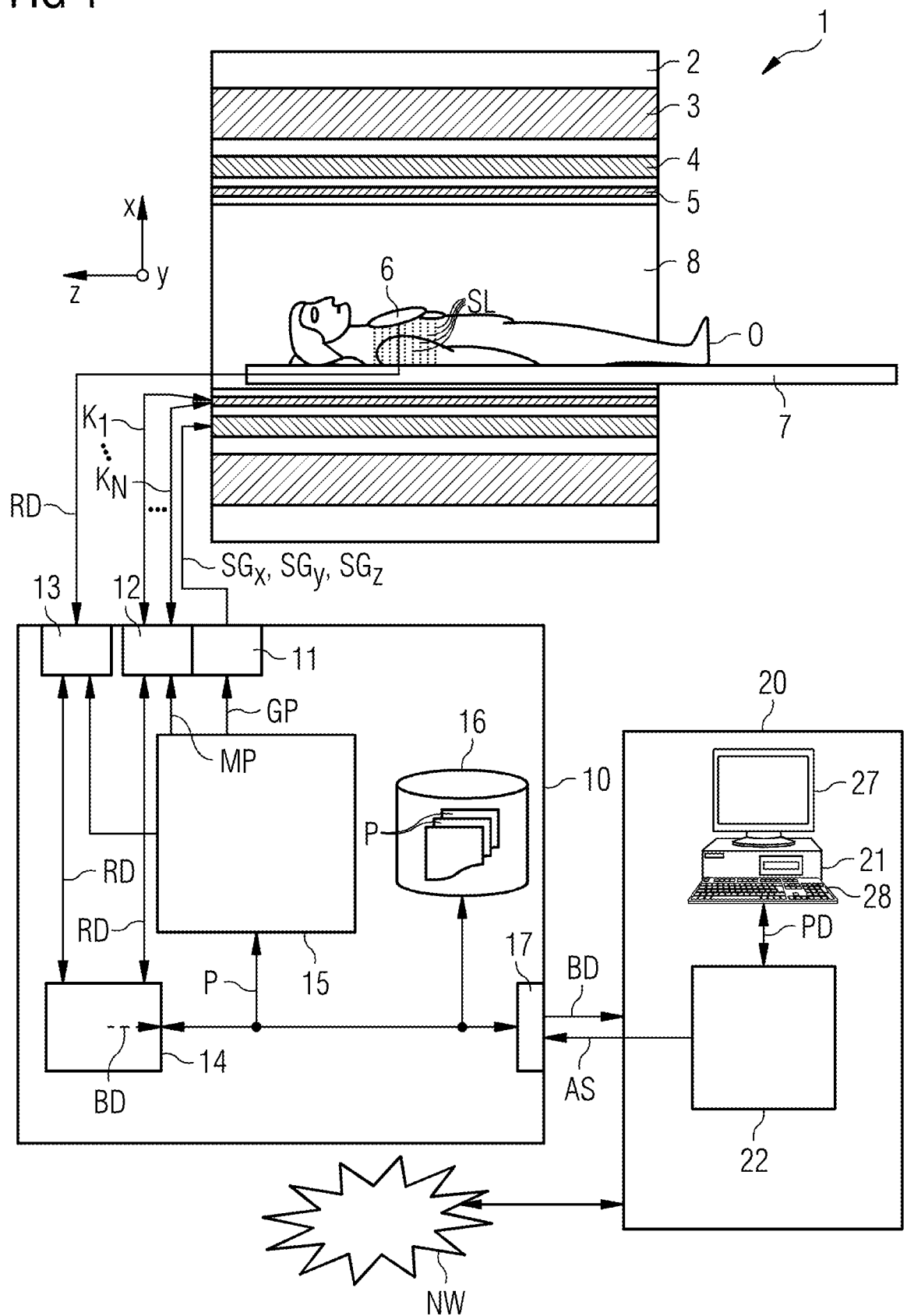
FIG. 1 is a schematic illustration of a magnetic resonance tomography system according to one exemplary embodiment of the invention.

FIG. 1 is a schematic illustration of an inventive magnetic resonance tomography system 1. The system includes the actual magnetic resonance scanner 2 with a scanning volume or patient tunnel 8 located therein. A bed 7 can be moved into this patient tunnel 8, so that an examination object O (for example patient/test subject or material for examination) lying thereon during an examination can be supported at a specific position inside the magnetic resonance scanner 2 relative to the magnet system and radio frequency system arranged therein, or can also be moved between different positions during a scan.

Fundamental components of the magnetic resonance scanner 2 are a basic field magnet 3, a gradient system 4 with gradient coils in order to apply arbitrary magnetic field gradients in the x, y and z directions, as well as a whole body radio frequency coil 5. Alternatively or additionally, local transmit coils can also be used for exciting magnetic resonance signals, as is often the case for example with imaging of the knees.

Magnetic resonance signals induced in the examination object O can be received by the whole body coil 5 with which, as a rule, the radio frequency signals for inducing the magnetic resonance signals can also be emitted. However, these signal are conventionally received by local coils 6 placed, for example, on or under the examination object O. All of these components are basically known to those skilled in the art, and thus are shown only schematically in FIG. 1.

The whole body radio frequency coil 5 can be, for example, in the form of a birdcage antenna, a number of individual antenna rods which can be controlled separately as individual transmit channels $K_1, \ldots, K_N$ by a control computer 10. In other words the magnetic resonance tomography system 1 is a pTX-capable system. It should be noted, however, that the inventive method can also be applied to conventional magnetic resonance tomography systems having only one transmit channel.

The control computer 10 can be a control system having a large number of stand-alone computers—optionally spatially separate and connected to each other by suitable bus systems or cables or the like. This control computer 10 is connected by a terminal interface 17 to a terminal 20 via which an operator can control the entire magnetic resonance tomography system 1. In the present case this terminal 20 has a computer 21 with keyboard 28, one or more screen(s) 27 and further input devices such as a mouse or the like, so that the operator has a graphic user interface.

The control computer 10 has inter alia a gradient controller 11 which can in turn be composed of a number of sub-components. The individual gradient coils are connected by this gradient controller 11 to control signals SGx, SGy, SGz. These are gradient pulses that are set during a scan at precisely specified temporal positions and with an exactly specified temporal course, in order to scan the examination object O and associated k-space preferably in individual slices SL according to a pulse sequence PS.

The control computer 10 also has a radio frequency transmit/receive unit 12. This RF transmit/receive unit 12 is similarly composed of a number of sub-components in order to give up radio frequency pulses, in each case separately and simultaneously, on the individual transmit channels $K_1, \ldots K_N$, in other words in this case on the individually controllable antenna rods of the body coil 5. Magnetic resonance signals can also be received via the transmit/receive unit 12. However, in this exemplary embodiment this occurs with the aid of the local coils 6. The raw data RD received by these local coils 6 are read out and processed by an RF receive unit 13. The magnetic resonance signals received by the local coils or by the whole body coil 5 by the RF transmit/receive unit 12 are passed as raw data RD to a reconstruction unit 14 which reconstructs the image data BD therefrom and stores this in a storage device 16 and/or passes it via the interface 17 to the terminal 20, so that the operator can examine it. The image data BD can also be stored and/or displayed via a network NW at other locations and be evaluated. If the local coils 6 have a suitable switching unit, then this can also be connected to an RF transmit/receive unit 12 in order to also use the local coils for transmission, in particular in pTX mode.

The gradient controller 11, the RF transmit/receive unit 12 and the receive unit 13 for the local coils 6 are each controlled in a coordinated manner by a scan controller 15. By appropriate commands this ensures that a desired gradient pulse train GP is emitted by suitable gradient control signals SGx, SGy, SGz, and controls the RF transmit/receive unit 12 in parallel such that a multi-channel pulse train MP is emitted, in other words that the relevant radio frequency pulses are provided simultaneously on the individual transmit rods of the whole body coil 5 on the individual transmit channels $K_1, \ldots K_N$. In addition it must be ensured that, at the relevant instant, the magnetic resonance signals on the local coils 6 are read out and processed further by the RF receive unit 13 or possible signals on the whole body coil 5 are read out and processed further by the RF transmit/receive unit 12. The scan controller 15 specifies the corresponding signals, in particular the multi-channel-pulse train MP on the radio frequency transmit/receive unit 12 and the gradient pulse train GP on the gradient-controller 11, according to a specified control protocol P. All control data, which has to be adjusted according to a specified pulse sequence PS during a scan, is stored in this control protocol P.

A large number of control protocols P is conventionally stored in a storage device 16 for different scans. These could be selected by the operator via the terminal 20 and could optionally be varied to then have a suitable control protocol P available for the currently desired scan, with which protocol the scan controller 15 can operate. Furthermore, the operator can also retrieve control protocols P via a network NW, for example from a manufacturer of the magnetic resonance system, and then optionally modify and use them.

The underlying sequence of a magnetic resonance scan of this kind and the components for control are known to those skilled in the art, so they need not be described in further detail herein. Furthermore, a magnetic resonance scanner 2 of this kind and the associated control computer can still have a large number of further components which are not explained in detail here either. The magnetic resonance scanner 2 can also have a different construction, for example with a laterally open patient space, and, in principle, the radio frequency whole body coil does not have to be constructed as a birdcage antenna.

FIG. 1 also schematically shows an inventive pulse sequence determining device 22 (also called a "creation processor") which is used for determining a pulse sequence PS. For a specific scan this pulse sequence PS contains inter alia a pulse train GP in order to pass through a specific trajectory in the k-space, and a radio frequency pulse train coordinated therewith, here a multi-channel pulse train MP, for controlling the individual transmit channels $K_1, \ldots, K_N$.

In the present case the pulse sequence PS is created on the basis of the inventive method. The pulse sequence-determining device 22 can be incorporated in the magnetic resonance tomography system 1 and be a component of the terminal 20 or in particular also a component of the control computer 10. However, the pulse sequence-determining device 22 can also be present externally as an independent unit and be designed for use with a plurality of different magnetic resonance systems.

From the description above it is apparent that the invention effectively provides possibilities for improving a method for controlling a magnetic resonance tomography system for generating magnetic resonance image data in respect of speed, flexibly and image quality.

Figure 2:
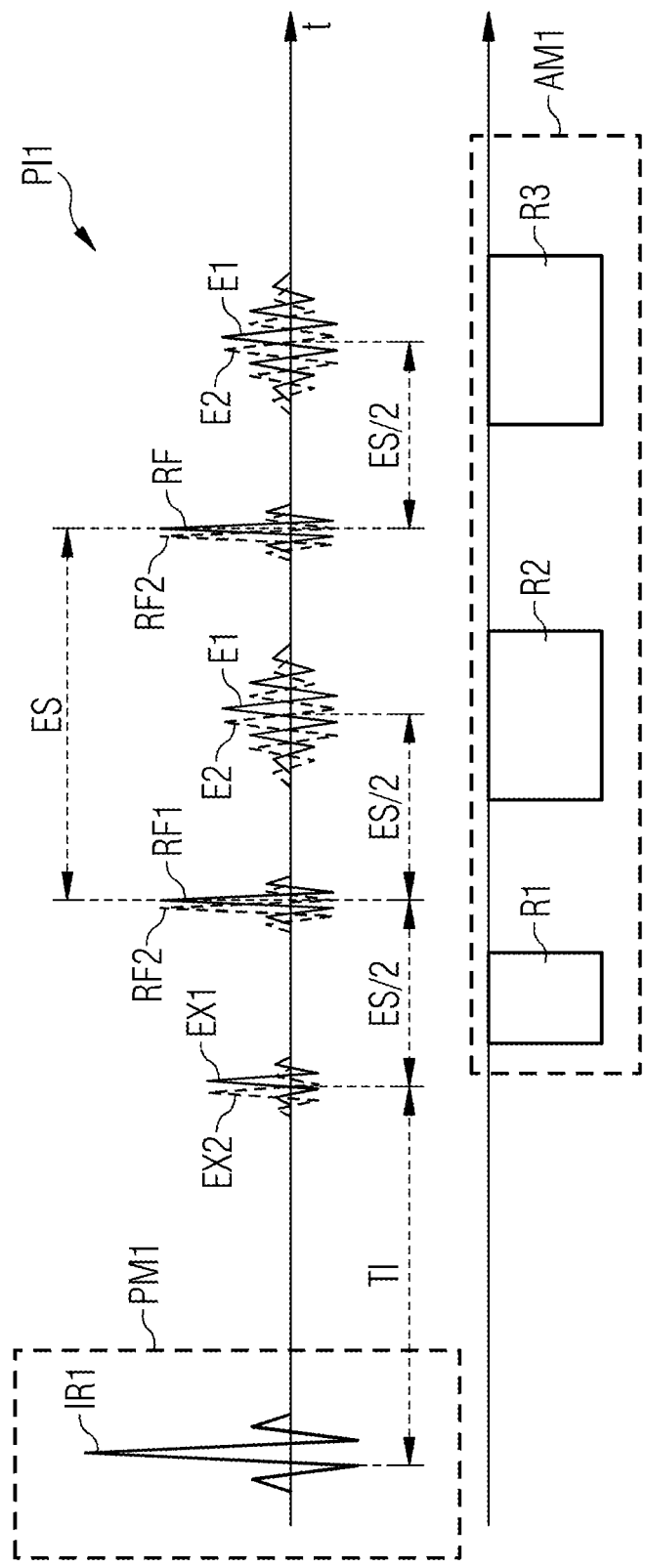
FIG. 2 shows a pulse iteration as part of an exemplary pulse sequence according to the inventive method.

FIG. 2 shows a first pulse iteration PI1 as part of an exemplary pulse sequence PS, which can result from the inventive method. The time axis t runs from left to right. Two sub-volumes are acquired.

The first pulse iteration PI1 from a first preparation pulse module PM1, which comprises only one preparation pulse IR1 here, is expressed. This preparation pulse prepares the first sub-volume S1 but not the second sub-volume S2.

After an inversion time TI has elapsed, two excitation pulses EX1, EX2 occur, which are typically played out at the same time (see for example "Blipped-Controlled Aliasing in Parallel Imaging for Simultaneous Multislice Echo Planar Imaging With Reduced g-Factor Penalty"; Setsompop et al. Magnetic Resonance in Medicine 67:1210-1224 (2012)) and are shown here (as well as the refocusing pulses RF1, RF2 and the echoes E1, E2) slightly temporally offset solely for a better understanding. The excitation pulses EX1, EX2 are followed after a half echo spacing ES/2 by two refocusing pulses RF1, RF2. The two pulses respectively act on the two acquired sub-volumes S1, S2. A first readout gradient R1 is applied between the excitation pulses EX1, EX2 and refocusing pulses RF1, RF2. This first readout gradient R1 is typically also called a "pre-phasing gradient". It pre-phases the spins such that the k-space center falls exactly at the instant ES/2 during subsequent reading out. After a further half echo spacing ES/2 a first echo E1, E2 occurs for each sub-volume S1, S2 within a second readout gradient R2. The sequence of refocusing pulses RF1, RF2 and echo E1, E2 is repeated during the course of a further readout R3 a whole echo spacing ES after the refocusing pulses RF1, RF2. The readout gradients constitute the first readout module AM1.

Figure 3:
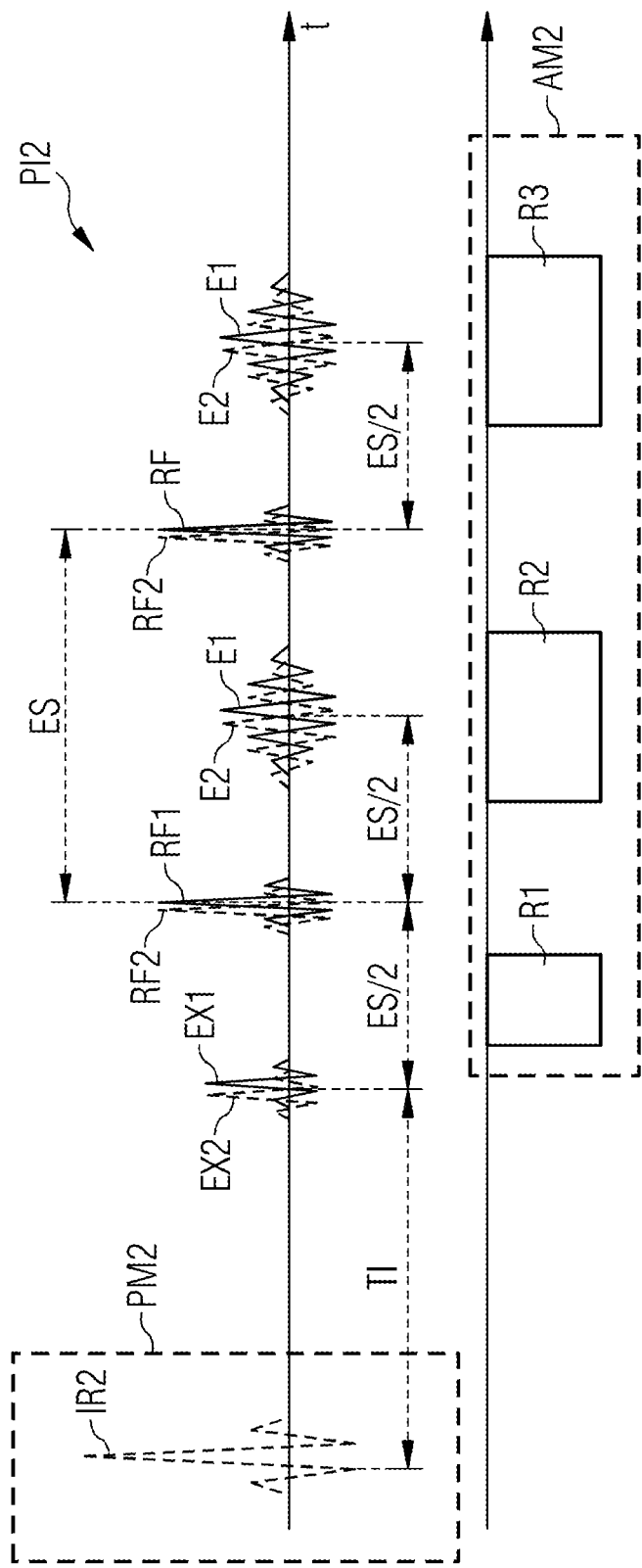
FIG. 3 shows a further pulse iteration as part of an exemplary pulse sequence according to the inventive method.

FIG. 3 shows a further pulse iteration PI2 as part of an exemplary pulse sequence PS which can result from the inventive method. The time axis t again runs from left to right.

The second pulse iteration PI2 from a second preparation pulse module PM2, which likewise comprises only one preparation pulse IR2 here, is expressed, and for better differentiation from the first preparation pulse IR1 this is shown in broken lines.

The readout with the readout module AM2 takes place according to the readout in FIG. 2, with the second sub-volume S2 having accordingly been prepared by the second preparation pulse module PM2 and the first sub-volume S1 has not.

Figure 4:
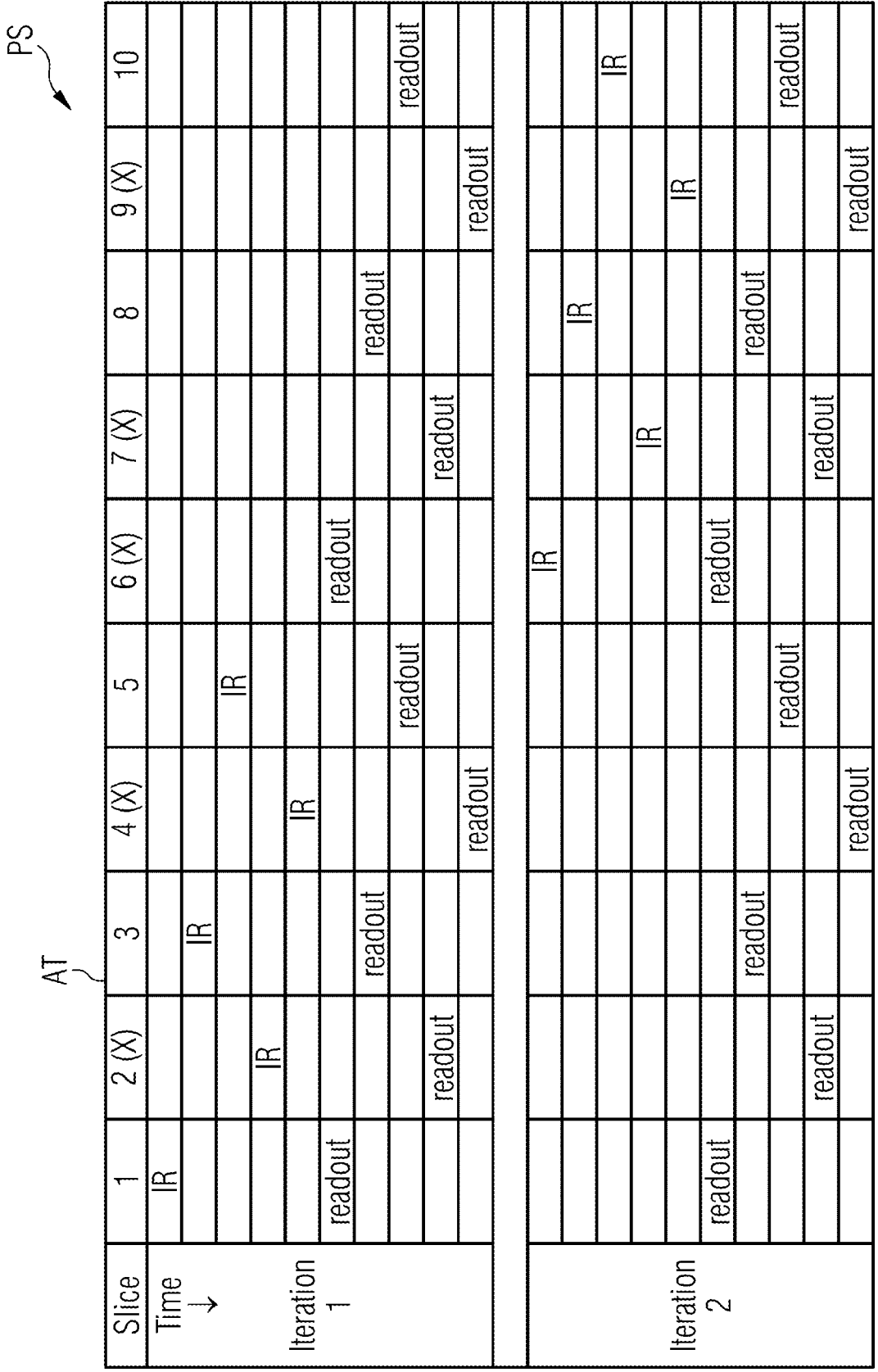
FIG. 4 shows a sequence table as an example of a pulse sequence according to the prior art.
Figure 5:
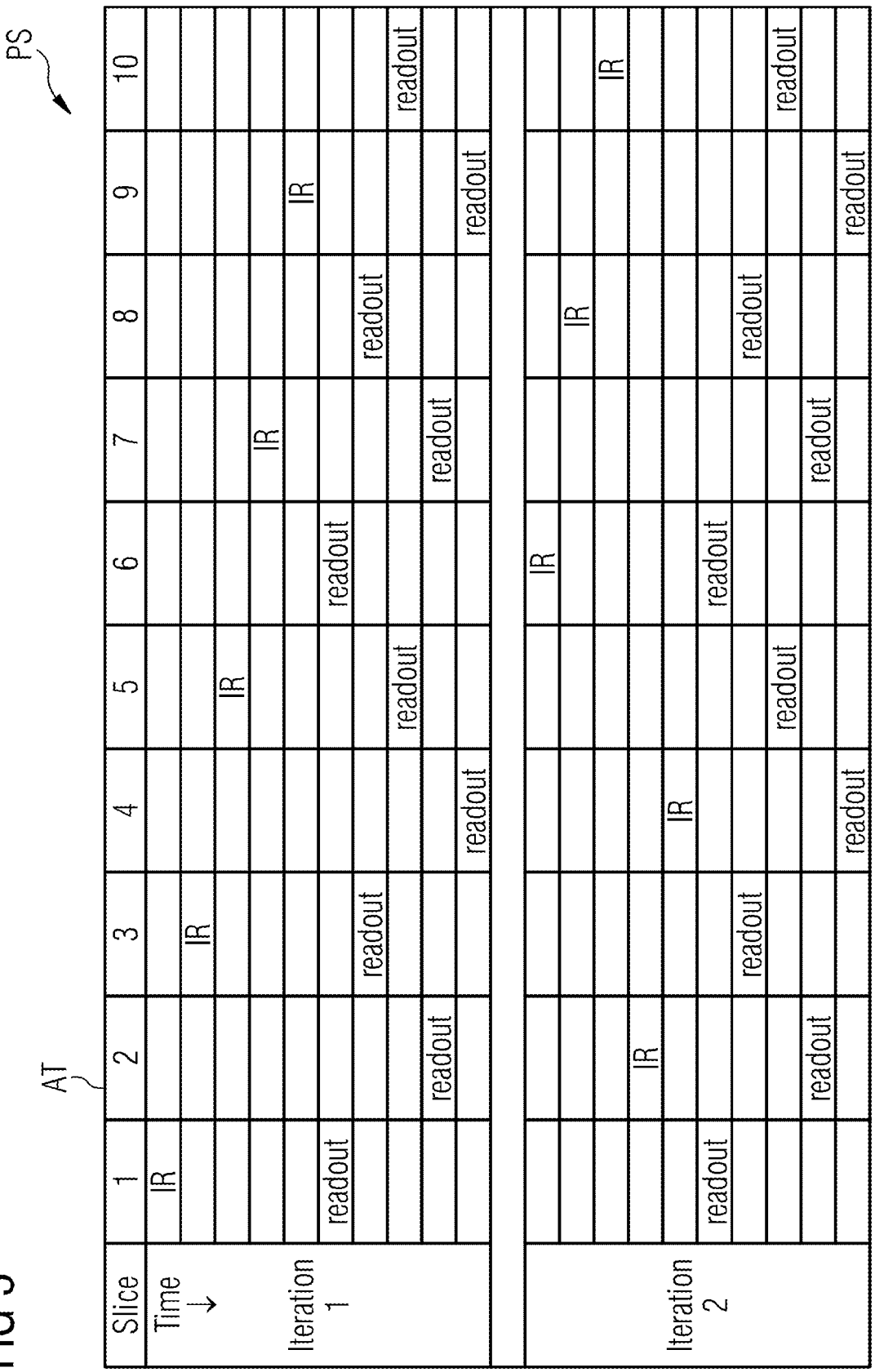
FIG. 5 shows a sequence table as an example of a preferred pulse sequence according to the invention.
Figure 6:
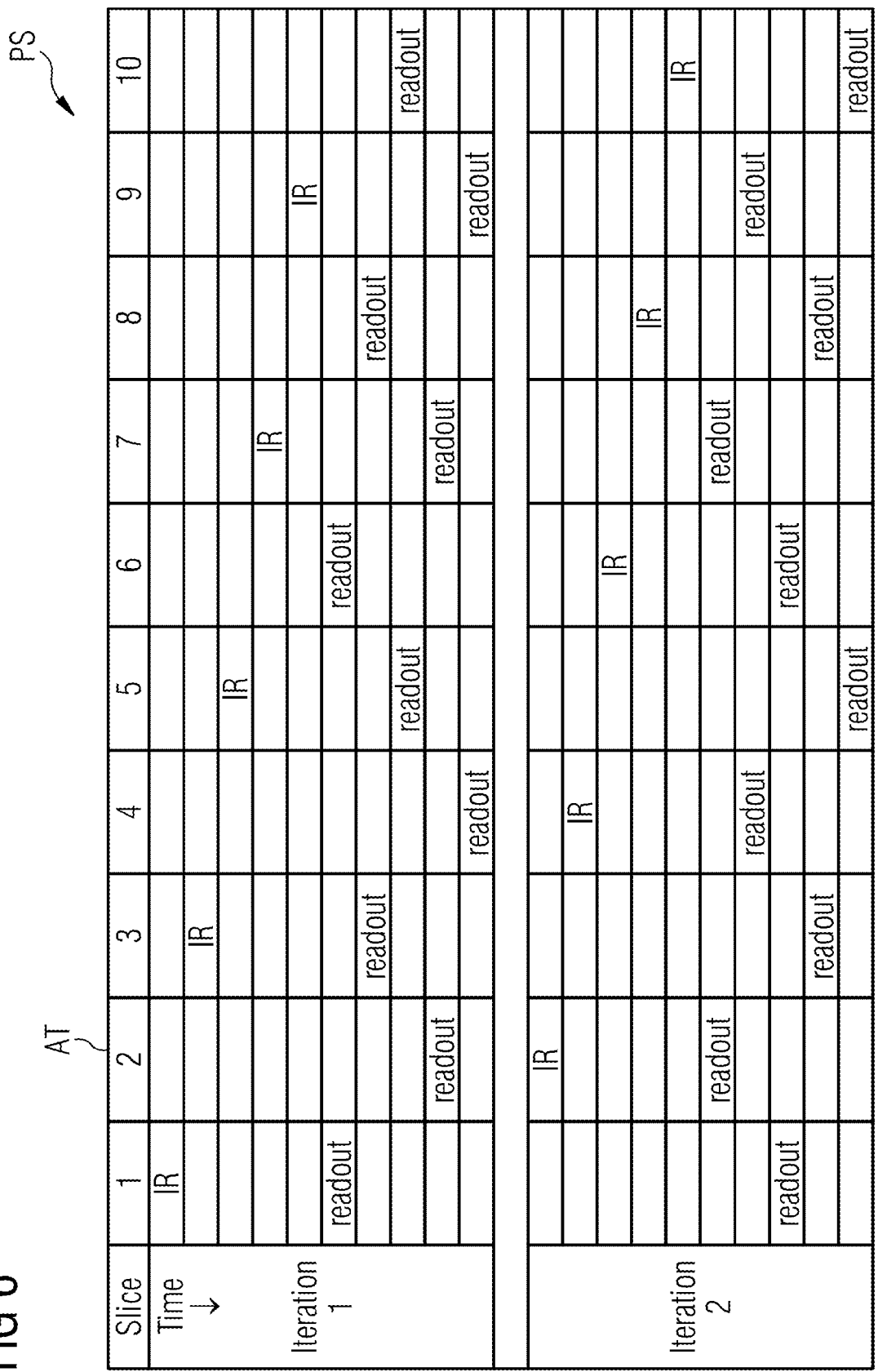
FIG. 6 shows a sequence table as a further example of a preferred pulse sequence according to the invention.

FIG. 4 shows a sequence table AT as an example of a pulse sequence PS according to the prior art. FIGS. 5 and 6 preferred sequence tables AT according to the invention.

Only the signals that are most important to the invention are shown in these sequence tables AT. With regard to the pulse sequence, reference is made to FIGS. 2 and 3, with the difference that now a total of 10 sub-volumes ("slice") are read out. The preparation pulses within a pulse iteration PI1, PI2 are, for example, arranged such that they are all applied within the inversion time T1. The time runs from top to bottom, so the process passes firstly through iteration 1 and then iteration 2.

In FIG. 4 (prior art) the first five adjacent sub-volumes S1, S2, S3, S4, S5 are prepared in the first pulse iteration PI1. This leads to cross talk in the sub-volumes S2 and S4 which are identified by "(X)". The second five adjacent sub-volumes S6, S7, S8, S9, S10 are prepared in the second pulse iteration PI2. This leads to cross talk in the sub-volumes S6, S7 and S9, which are likewise identified by "(X)".

In FIGS. 5 and 6 the odd-numbered five sub-volumes S1, S3, S5, S7, S9 are prepared in the first pulse iteration PI1 and the even-numbered five sub-volumes S2, S4, S6, S8, S10 in the second pulse iteration PI2 (the reverse would also be possible). If these pulse sequences PS are applied then no cross talk can be found in the acquisitions.

In FIG. 5 the time intervals between the preparation pulses for the first sub-volume S1 and the second sub-volume S2 or for the third sub-volume S3 and the fourth sub-volume S4 are chosen to be especially long.

In FIG. 6 the time intervals between the preparation pulses for the odd-numbered and even-numbered preparation pulses are selected to be as equidistant as possible.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for operating a magnetic resonance (MR) tomography apparatus, comprising:
   from a control computer, using a pulse sequence to operate an MR data acquisition scanner of the MR tomography apparatus in order to acquire MR raw data from a subject by exciting respectively different transverse magnetizations in a plurality of sub-volumes of the subject;
   in executing said pulse sequence, executing a sequence of pulse iterations that are each configured to prepare, excite, and read out said sub-volumes, wherein said pulse iterations occur temporally in said pulse sequence so that a readout of a respective sub-volume occurs when the pulse sequence is applied between a preparation of two sub-volumes that are spatially directly adjacent to said respective sub-volume, and wherein said pulse iterations comprise at least two successive pulse iterations that include a first pulse iteration comprising a first preparation pulse module followed by a first readout module, and a second pulse iteration comprising a second preparation pulse module followed by a second readout module;

during execution of said first pulse iteration by said MR data acquisition scanner, using said first preparation pulse module to prepare a first sub-volume among said plurality of sub-volumes and to read out said first sub-volume; and during execution of said second pulse iteration by said MR data acquisition scanner, using said second preparation pulse module to prepare a second sub-volume among said plurality of sub-volumes, and using said second readout module to read out said second sub-volume; and making the raw data acquired with said pulse sequence available in electronic form from said computer as a data file.

2. A magnetic resonance (MR) apparatus comprising:
an MR data acquisition scanner; and
a control computer configured to:
  use a pulse sequence to operate said MR data acquisition scanner in order to acquire MR raw data from a subject by exciting respectively different transverse magnetizations in a plurality of sub-volumes of the subject;
  operate said MR data acquisition scanner, when executing said pulse sequence, so as to execute a sequence of pulse iterations that are each configured to prepare, excite, and read out said sub-volumes,
  wherein said pulse iterations occur temporally in said pulse sequence so that a readout of a respective sub-volume occurs when the pulse sequence is applied between a preparation of two sub-volumes that are spatially directly adjacent to said respective sub-volume, and
  wherein said pulse iterations comprise at least two successive pulse iterations that include a first pulse iteration comprising a first preparation pulse module followed by a first readout module, and a second pulse iteration comprising a second preparation pulse module followed by a second readout module,
  during execution of said first pulse iteration by said MR data acquisition scanner, use said first preparation pulse module to prepare a first sub-volume among said plurality of sub-volumes and to read out said first sub-volume;
  during execution of said second pulse iteration by said MR data acquisition scanner, use said second preparation pulse module to prepare a second sub-volume among said plurality of sub-volumes, and use said second readout module to read out said second sub-volume; and
  make the raw data acquired with said pulse sequence available in electronic form from said computer, as a data file.

3. A non-transitory, computer-readable data storage medium encoded with programming instructions, said storage medium being loaded into a computer of a magnetic resonance (MR) apparatus comprising an MR data acquisition scanner, and said programming instructions causing said computer to:
  use a pulse sequence to operate said MR data acquisition scanner in order to acquire MR raw data from a subject, by exciting respectively different transverse magnetizations in a plurality of sub-volumes of the subject;
  in executing said pulse sequence, execute a sequence of pulse iterations that are each configured to prepare, excite and read out said sub-volumes,
  wherein said pulse iterations occur temporally in said pulse sequence so that a readout of a respective sub-volume occurs when the pulse sequence is applied between a preparation of two sub-volumes that are spatially directly adjacent to said respective sub-volume, and
  wherein said pulse iterations comprise at least two successive pulse iterations that include a first pulse iteration comprising a first preparation pulse module followed by a first readout module, and a second pulse iteration comprising a second preparation pulse module followed by a second readout module,
  during execution of said first pulse iteration by said MR data acquisition scanner, use said first preparation pulse module to prepare a first sub-volume among said plurality of sub-volumes and to read out said first sub-volume; and
  during execution of said second pulse iteration by said MR data acquisition scanner, use said second preparation pulse module to prepare a second sub-volume among said plurality of sub-volumes, and use said second readout module to read out said second sub-volume; and
  make the raw data acquired with said pulse sequence available in electronic form from said computer, as a data file.

4. A method for generating a pulse sequence for operating a magnetic resonance (MR) apparatus in order to acquire MR raw data from a subject by exciting respectively different transverse magnetizations in a plurality of sub-volumes of the subject, said method comprising:
  providing a computer with an input that designates a sub-volume quantity of sub-volumes in said plurality of sub-volumes, said sub-volumes in said sub-volume quantity being spatially directly adjacent to each other and parallel to each other;
  providing said computer with a further input that designates an excitation quantity of sub-volumes in said plurality of sub-volumes that are to be simultaneously excited in said pulse sequence;
  providing said computer with another input that designates a scan quality comprising scans that are to be implemented on said sub-volumes;
  in said computer, generating a pulse sequence, comprising a plurality of pulse iterations that are each configured to prepare, in a preparation module, excite, and read out, in a readout module, said sub-volumes, said sequence table comprising different temporal relationships for said preparation and said readout,
  wherein said plurality of pulse iterations comprise at least two successive pulse iterations that include a first pulse iteration comprising a first preparation pulse module followed by a first readout module, and a second pulse iteration comprising a second preparation pulse module followed by a second readout module;
  in said computer, using said sequence table to generate said pulse sequence so as to distribute, in said pulse sequence, the respective preparation pulse modules of the pulse iterations with respect to said scan quantity so that, within a respective scan, as few adjacent sub-volumes as possible are prepared by one of the preparation modules, and to cause respective sub-volumes that are simultaneously excited to be excited and read-out in one scan according to said excitation quantity with, among the simultaneously excited and readout sub-volumes, at least one sub-volume being prepared in advance with a preparation pulse module;

in said computer, during execution of said first pulse iteration by said MR data acquisition scanner, using said first preparation pulse module to prepare a first sub-volume among said plurality of sub-volumes and to read out said first sub-volume; and in said computer, during execution of said second pulse iteration by said MR data acquisition scanner, using said second preparation pulse module to prepare a second sub-volume among said plurality of sub-volumes, and using said second readout module to read out said second sub-volume; and making the pulse sequence created by said computer available in electronic form from said computer, in a format configured to operate said MR apparatus.

5. A method as claimed in claim 1, comprising:
in a reconstruction computer, reconstructing image data of a volume of the subject comprising said sub-volumes, from said raw data acquired from said sub-volumes.

6. A method as claimed in claim 1 comprising at least one of:
during execution of said first pulse iteration by said MR data acquisition scanner, between said first preparation pulse module and said first readout module, executing a third preparation pulse module that prepares a third sub-volume among said plurality of volumes and, after executing said first readout module executing a third readout module to read out said third sub-volume; and
during execution of said second pulse iteration by said MR data acquisition scanner, between said second preparation pulse module and said second readout module, executing a fourth preparation pulse module that prepares a fourth sub-volume among said plurality of volumes and, after executing said second readout module executing a fourth readout module to read out said fourth sub-volume.

7. A method as claimed in claim 1, comprising:
selecting said pulse sequence as at least one sequence from a group including at least one of EPI (Echo Planar Imaging), segmented EPI, GRE (Gradient Echo), RESOLVE (echo planar imaging sequence segmented in the readout direction), SE (Spin Echo), STEAM (Stimulated Echo Acquisition Mode), STIR (Short-Tau Inversion Recovery), TSE (Turbo-Spin-Echo), and FLAIR (Fluid Attenuated Inversion Recovery).

8. A method as claimed in claim 7, comprising:
operating said MR data acquisition scanner with said at least one pulse sequence selected from said group to acquire said MR raw data with a contrast selected from the group including at least one of spin-grid relaxation T1, spin-spin relaxation T2, and proton density PD.

9. A method as claimed in claim 8, comprising:
selecting said contrast together with a sequence from said group that uses inversion preparations, in a combination selected from the group including at least one of P1 with T1 FLAIR, T2 with T2 FLAIR, and PD with PD FLAIR.

10. A method as claimed in claim 8, comprising:
selecting said contrast together with a sequence from said group that uses spatially selective fat saturation (fs) in a combination selected from the group including at least one of T1 with T1-fs, T2 with T2-fs, and PD with PD-fs.

11. A method as claimed in claim 8, comprising:
selecting said contrast together with a sequence from said group using diffusion (Diff), in a combination selected from the group including at least one of EPI T2* combined with EPI Diff, and RESOLVE T2* combined RESOLVE Diff.

12. A method as claimed in claim 8, comprising:
selecting said contrast to be T2 in combination with T1-STEAM (STEAM sequence with T1-preparation).

13. A method as claimed in claim 1, wherein each of said pulse iterations comprises a preparation pulse module followed by a readout module, said method comprising:
providing said computer with an input that designates a sub-volume quantity of sub-volumes in said plurality of sub-volumes, said sub-volumes in said sub-volume quantity being spatially directly adjacent to each other and parallel to each other;
providing said computer with a further input that designates an excitation quantity of sub-volumes in said plurality of sub-volumes that are to be simultaneously excited in said pulse sequence;
providing said computer with another input that designates a scan quality comprising scans that are to be implemented on said sub-volumes;
in said computer, distributing, in said pulse sequence, the respective preparation pulse modules of the pulse iterations with respect to the scan quantity, so that, within a respective scan, as few adjacent sub-volumes as possible are prepared by one of the preparation modules;
operating the MR data acquisition scanner to, in said pulse sequence, prepare the respective sub-volumes so that respective sub-volumes are each simultaneously excited and read out in one scan according to said excitation quantity and, among the simultaneously excited and readout sub-volumes, preparing at least one sub-volume in advance with a preparation pulse module; and
operating said MR data acquisition scanner to repeat preparation of the sub-volumes until all of said MR raw data have been acquired.

\* \* \* \* \*